United States Patent [19]

Haba

[11] Patent Number: 5,784,457
[45] Date of Patent: Jul. 21, 1998

[54] MULTIMEDIA COMMUNICATION APPARATUS AND METHOD WITH AUDIO CODEC SELECTION AND AUDIO MATING WHEN SETTING CODES

[75] Inventor: Yoshito Haba, Tokyo, Japan

[73] Assignee: Canon Kabushiki Kaisha, Tokyo, Japan

[21] Appl. No.: 64,861

[22] Filed: May 18, 1993

[30] Foreign Application Priority Data

May 25, 1992 [JP] Japan .................................. 4-157582

[51] Int. Cl.[6] .................................................. H04N 7/14
[52] U.S. Cl. .............................. 379/421; 348/16; 348/17
[58] Field of Search ..................... 379/52, 202, 421, 379/90.01, 93.05; 381/81, 85, 86, 94; 348/14, 15, 16, 17, 94.1

[56] References Cited

U.S. PATENT DOCUMENTS

| | | | |
|---|---|---|---|
| 3,842,211 | 10/1974 | Metro | 381/4 |
| 4,529,840 | 7/1985 | Colton et al. | 348/15 |
| 4,675,905 | 6/1987 | Flora et al. | 381/81 |
| 4,845,636 | 7/1989 | Walker | 348/14 X |
| 5,231,492 | 7/1993 | Dangi et al. | 348/17 |
| 5,243,640 | 9/1993 | Hadley et al. | 379/59 |
| 5,301,191 | 4/1994 | Otani | 370/110.1 |
| 5,333,153 | 7/1994 | Brown et al. | 375/104 |
| 5,367,522 | 11/1994 | Otani | 370/110.1 |
| 5,402,418 | 3/1995 | Shibata et al. | 348/15 |
| 5,444,312 | 8/1995 | Noblett et al. | 381/94 X |
| 5,502,727 | 3/1996 | Catanzaro et al. | 370/94.2 |
| 5,675,393 | 10/1997 | Chida | 348/15 |

FOREIGN PATENT DOCUMENTS

| | | | |
|---|---|---|---|
| 0039428 | 11/1981 | European Pat. Off. | H04B 12/02 |
| 0361384 | 4/1990 | European Pat. Off. | H04B 14/04 |
| 0193129 | 11/1982 | Japan | 379/421 |
| 6240807 | 2/1987 | Japan | H03F 1/00 |
| 0009318 | 1/1988 | Japan | 379/421 |
| 2012134 | 7/1979 | United Kingdom | H03K 13/01 |

Primary Examiner—Krista Zele
Assistant Examiner—Scott L. Weaver
Attorney, Agent, or Firm—Morgan & Finnegan, LLP

[57] ABSTRACT

A communication apparatus having a plurality of audio CODEC and communication method thereof. When a coding mode for transmitting audio information is set, the audio CODEC corresponding to the coding mode is selected and switched. When the coding mode of the audio information is instructed from the terminal on the transmission side, the audio CODEC on the reception-side terminal is switched according to the instruction. When these audio CODEC are switched, generation of audio noise can be suppressed by setting the mute on the audio information.

18 Claims, 9 Drawing Sheets

MULTIMEDIA COMMUNICATION APPARATUS AND METHOD WITH AUDIO CODEC SELECTION AND AUDIO MATING WHEN SETTING CODES

BACKGROUND OF THE INVENTION

The present invention relates to a communication apparatus capable of outputting sound by coding and transmitting audio information or receiving and decoding coded audio information, and communication method thereof.

Recently, communication services by ISDN (Integrated Service Digital Network) have been put to practical use and audiovisual teleservices using such digital network, namely, an audiovisual telephone apparatus and videoconference, have been attracting attention. Services, protocol, and frame structure of multimedia services for this audiovisual teleservices are defined in CCITT (The International Telegraph and Telephone Consultative Committee) Recommendations H.320, H.242, H. 221, H.261.

Recommendation H.221 defines coding allocation of a Bit rate Allocation Signal (BAS) which is used for exchange of frame structures and has channel capabilities from a 64 to 1920 kbit/s channel in audiovisual teleservices and mode designation.

Recommendation H.242 defines a protocol such as capability exchange and communication mode switching between audiovisual terminals using BAS. Recommendation H.320 defines system aspects of overall audiovisual services.

In the above recommendations, a method for performing multimedia communications, such as image, sound, and data communications, between the terminals by procedures such as terminal capability exchange sequence using the BAS in-channel and mode switching sequence by mode designation, after establishment of end-to-end physical connection and synchronism in-channel has been specified. The term "in-channel" as used herein refers to the B-channel or, in other words, the data channel, of the ISDN interface. Data transmitted in the B-channel includes, for example, voice data and video data. The term "out-channel" refers to the D-channel or, in other words, the control channel of the ISDN interface. The phrase "terminal capability exchange sequence using the BAS in-channel" refers to a capability exchange sequence being performed between the communications terminals using the Bit rate Allocation Signal (BAS) in order to maximize the communication function of each terminal. Also, the phrase "establishment of . . . synchronism in-channel" refers to the synchronism of data between communication terminals in-channel as established using the control channel.

Information transfer speed in each medium in the multimedia communication is determined by designating an audio coding mode on audio information. The information transfer speed of data information such as written on a document is determined by designating a transmission speed of the data information. Furthermore, transfer speed of image information is determined as the remaining bandwidth after the transfer speed of the audio information and that of the data information are subtracted from the information transfer speed of all communication paths. Accordingly, the information on the transfer speed when the transmission mode of a transmitting party is informed to the terminal of a receiving party in the BAS command needs to have only an audio coding mode and data transfer speed. As for the transfer speed of the image information, it is automatically set in the terminal of the receiving party.

Recommendation H.242 defines communication capability of audio information so as to enable to transmit/receive the audio information in accordance with (A-law) and (μ-law) of Recommendation G. 711. Designation of the audio mode which transmits/receives the audio information is performed within the audio communication capability when the terminal of a transmitting side transmits the BAS command to the terminal of the receiving party. The terminal which has received this BAS command must set the reception mode to the mode designated by the BAS command. However, the transmission mode and reception mode need not always be the same. It can be respectively set.

In the conventional multimedia communication apparatus, in the audio mode, when the communication mode which transmits the audio information is switched, noise is generated since the audio CODEC is switched. When the reception mode which receives the audio information is switched, there is a case where the audio information of the reception mode before the switching remains in the network. In this case, the coding mode of the audio information differs from the decoding mode, resulting in audio noise at the terminal of the reception side. Furthermore, when the communication mode is initialized, at the start of communication, the synchronizing procedure and audio CODEC are switched and timing for synchronism is staggered, thus resulting in generation of noise.

SUMMARY OF THE INVENTION

In the light of the above drawbacks, it is an object of the present invention to provide a communication method and apparatus which prevent noise generation when a communication mode of audio information is switched or initialization of the communication mode at the in-channel is set.

It is another object of the present invention to provide a communication method and apparatus which does not output noise when switching of the transmission audio CODEC when the transmission mode is switched at the transmission side by switching the transmission audio CODEC while the mute is set on the transmission sound.

It is another object of the present invention to provide a communication method and apparatus which switch the transmission audio CODEC when the transmission mode of the audio information is switched at the transmission side, while mute is set on the transmission sound for a predetermined period of time. Accordingly, in the reception-side terminal, when the timing for switching the reception audio CODEC is staggered, the audio information received before the reception audio CODEC is switched at the reception side will not be inputted into the reception audio CODEC after the reception audio CODEC has been switched. Thus, noise generation can be suppressed at the reception side.

It is another object of the present invention to provide a communication method and apparatus which does not output noise at switching of the reception audio CODEC in the reception-side terminal, by switching the reception audio CODEC while mute is set on the reception sound when the audio reception mode is switched at the reception-side terminal.

It is still another object of the present invention to provide a communication method and apparatus for switching the reception audio CODEC while mute is set on the reception sound at the reception-side terminal and the mute is active for a predetermined period of time. Accordingly, the decoded sound of the audio information before the audio CODEC is switched at the transmission side which remains in a communication line is not outputted. Thus, generation of noise at the initialization can be suppressed.

It is still another object of the present invention to provide a communication method and apparatus so as to be in the state where the mute is set on the transmission sound and reception sound at the synchronism of in-channel at the start of communication, capability exchange, and audio communication mode switching. Accordingly, when the audio communication mode is initialized, the audio information when the transmission audio CODEC or reception audio CODEC is switched cannot be outputted and generation of noise can be suppressed.

It is still another object of the present invention to provide a communication method and apparatus so as to be in the state where the mute is set on the transmission sound or reception sound at the synchronism of in-channel at the start of communication, capability exchange, and audio communication mode switching, and it is arranged so that the mute is active for a predetermined period of time. Accordingly, when the audio communication mode is initialized, audio noise can be suppressed. The audio noise is generated when the transmission audio CODEC and reception audio CODEC are switched, or when the coding method is not corresponding to the decoding method, resulting from the time difference between the switching of the transmission audio CODEC and that of the reception audio CODEC.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

Figure 1:
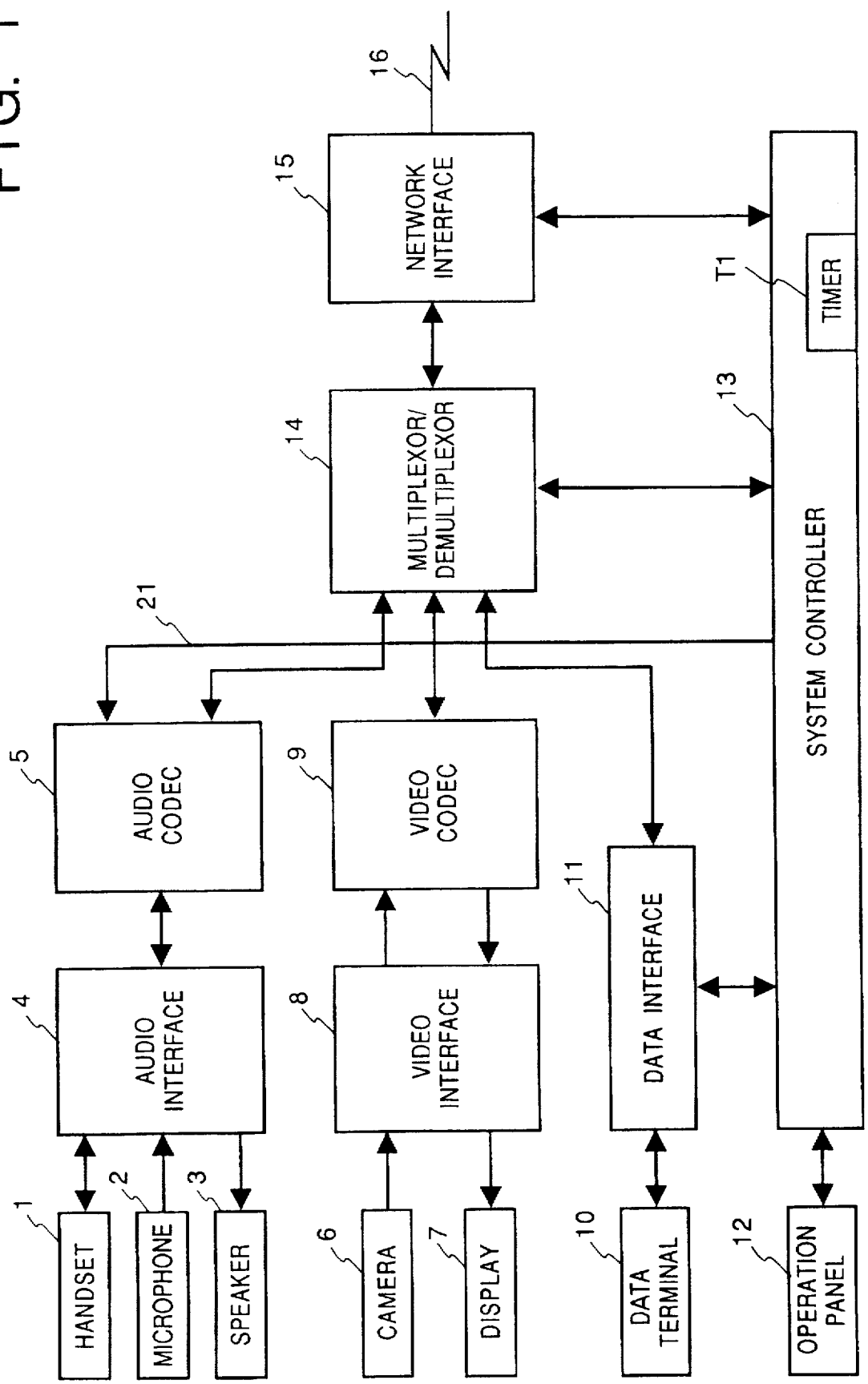
FIG. 1 is a block diagram of a multimedia communication apparatus according to an embodiment of the present invention.

FIG. 1 is a block diagram of a multimedia communication apparatus of the present invention. This communication apparatus can transmit/receive audio information and image information in addition to normal data.

In FIG. 1, numeral 1 is a handset for inputting/outputting sound, numeral 2 is a microphone for inputting sound, and numeral 3 is a speaker. Numeral 4 is an audio interface (I/F) comprising: a function to switch the connection between an audio CODEC 5 and the handset 1, microphone 2, and speaker 3 respectively; an on-/off-hook detection function for detecting whether the handset 1 is on hooked or off hooked, an echo cancel function for canceling echo when the microphone 2 and speaker 3 are used; and a generation function for generating dial tone, call signal tone, busy tone, and incoming call tone.

Numeral 5 is an audio coder/decoder (audio CODEC) having the function for performing A/D conversion on transmission audio information and coding the information and the function for decoding the received audio information and performing D/A conversion in accordance with the audio signal coding/decoding algorithm provided by the instruction from the system control unit 13 (which is described later). The audio signal coding/decoding algorithm includes 64 kbit/s Pulse Code Modulation (PCM) (A-law), 64 kbit/s PCM (μ-law), 7 kHz AUDIO Sub-Band Adaptive Differential Pulse Code Modulation (SB-ADPCM), 32 kbit/s Adaptive Differential Pulse Code Modulation (ADPCM), 16 kbit/s or 8 kbit/s Adaptive Predictive Coding (APC-AB).

Numeral 6 is a camera which is used to input a portrait, for example. Numeral 7 is a display for displaying the input image from the camera 6, an image received from the terminal of the other (transmitting) party, and operational screen. Numeral 8 is a video interface having the function for switching the connection with the camera 6 and display 7, the function for switching a display on the display 7 in the input image, received image, and operational screen, and the function for synthesizing image signals to display a split screen on the display 7, by the instruction of the system controller 13. Numeral 9 is an image coder/decoder (video CODEC) which has functions for performing A/D conversion on the transmission image information and coding the information, and for performing D/A conversion on the reception image information and decoding the information in accordance with CCITT Recommendation H.261.

Numeral 10 is a data terminal for data communication and numeral 11 is a data interface for routing the transmission data from the data terminal 10 and system controller 13 (to be described later) to a multiplexor/demultiplexor 14, and for routing the reception data from the network 16 to the data terminal 10 or system controller 13. Numeral 12 is an operation panel such as a keyboard or touch panel used for inputting control information. The system controller 13 comprising CPU, ROM, RAM, timer T1, and auxiliary storage generates an operation/display screen corresponding to the state of control all over the main apparatus, input control information, and occupied line, and executes application programs. The timer T1 times a predetermined time set by the CPU. When the predetermined time has passed, the timer T1 notifies the CPU.

Numeral 14 is a multiplexor/demultiplexor which multiplexes an audio signal from the audio CODEC 5, image signal from the video CODEC 9, data from the data interface 11, and command from the system controller 13 in a unit of transmission frame in accordance with CCITT Recommendation H.221. The multiplexor/demultiplexor 14 separates the received frame into an audio signal, a video signal, a data signal, and a command signal, which are components of the frame, and sends each signal to its corresponding unit. Numeral 15 is a network interface which controls an ISDN 16 in accordance with the ISDN user network interface.

Figure 2:
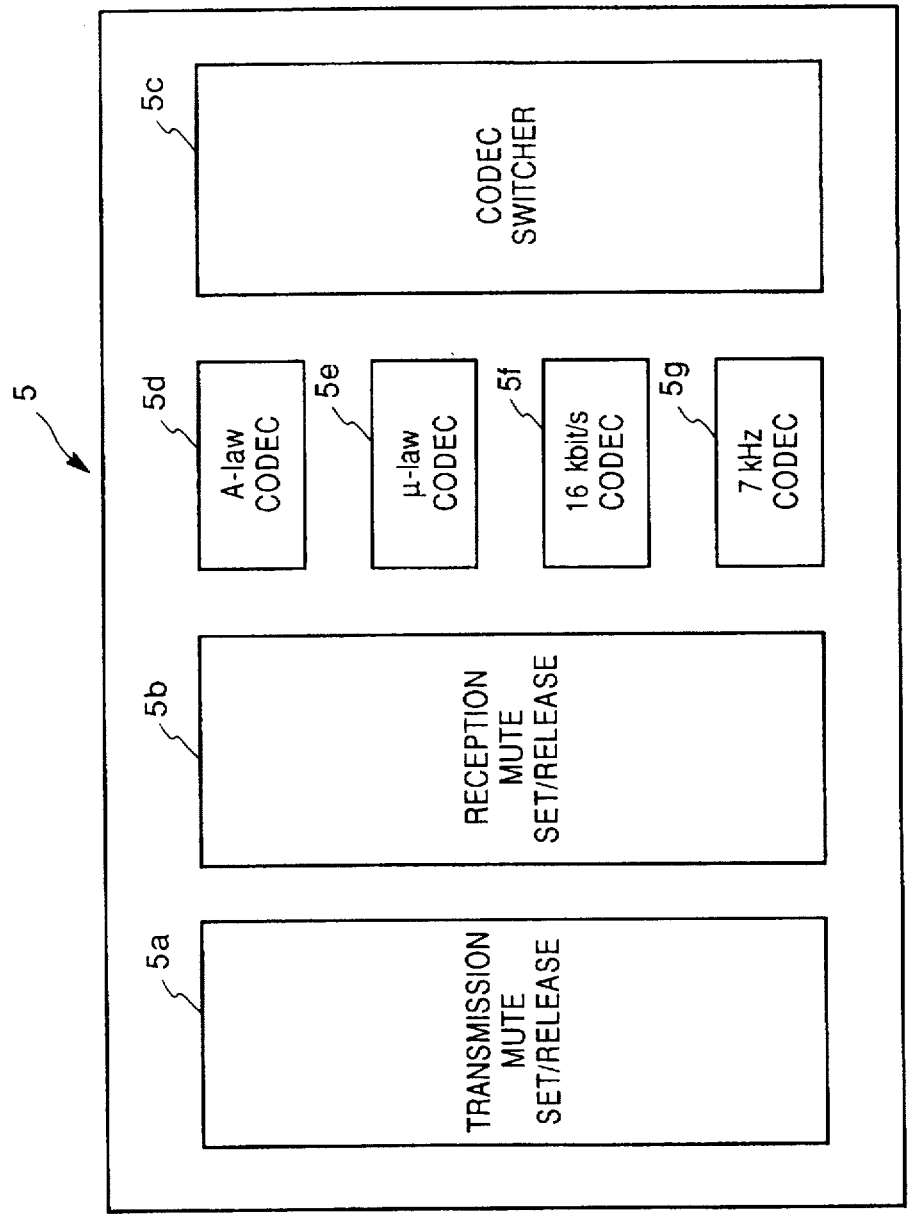
FIG. 2 is a block diagram showing the internal construction of the audio CODEC in the communication apparatus of the embodiment of FIG. 1.

FIG. 2 is a block diagram showing the construction of the audio CODEC 5 shown in FIG. 1.

In FIG. 2, numeral 5a is a transmission mute set/release which sets or releases the mute on the transmitting sound based on the instruction from the system controller 13. When the transmission mute set/release is set, transmitting the sound is inhibited. Numeral 5b is a reception mute set/release which sets or releases the mute on the reception sound based on the instruction from the controller 13. When the reception mute set/release is set, outputting the sound is inhibited. Numeral 5c is a CODEC switcher for respectively switching various types of audio CODEC for transmission and reception based on the instruction from the system controller 13. Numeral 5d is a 64 kbit/s PCM A-law CODEC, numeral 5e is a 64 kbit/s PCM µ-law CODEC, numeral 5f is a 16 kbit/s (e.g. APC-AB) CODEC, and 5g is a 64 kbit/s/56 kbit/s/48 kbit/s SB-ADPCM CODEC.

Figure 3:
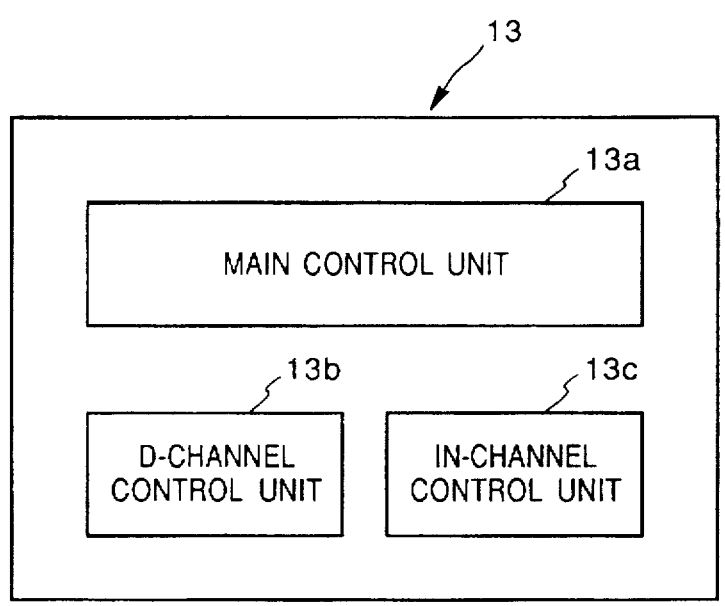
FIG. 3 is a block diagram showing the internal construction of the system controller in the communication apparatus of the embodiment of FIG. 1.

FIG. 3 is a block diagram showing the functional construction of the software of the system controller 13.

In FIG. 3, numeral 13a is a main control unit for controlling each device comprising the present apparatus and performing a communication between devices. Numeral 13b is a D-channel control unit for performing a D-channel control such as call set-up and call disconnection. Numeral 13c is an in-channel control unit for performing synchronization of in-channel, capability exchange, and audio communication mode switching.

The operation of the multimedia communication apparatus of the present invention is described along with the flowcharts of FIGS. 4-9.

Figure 4:
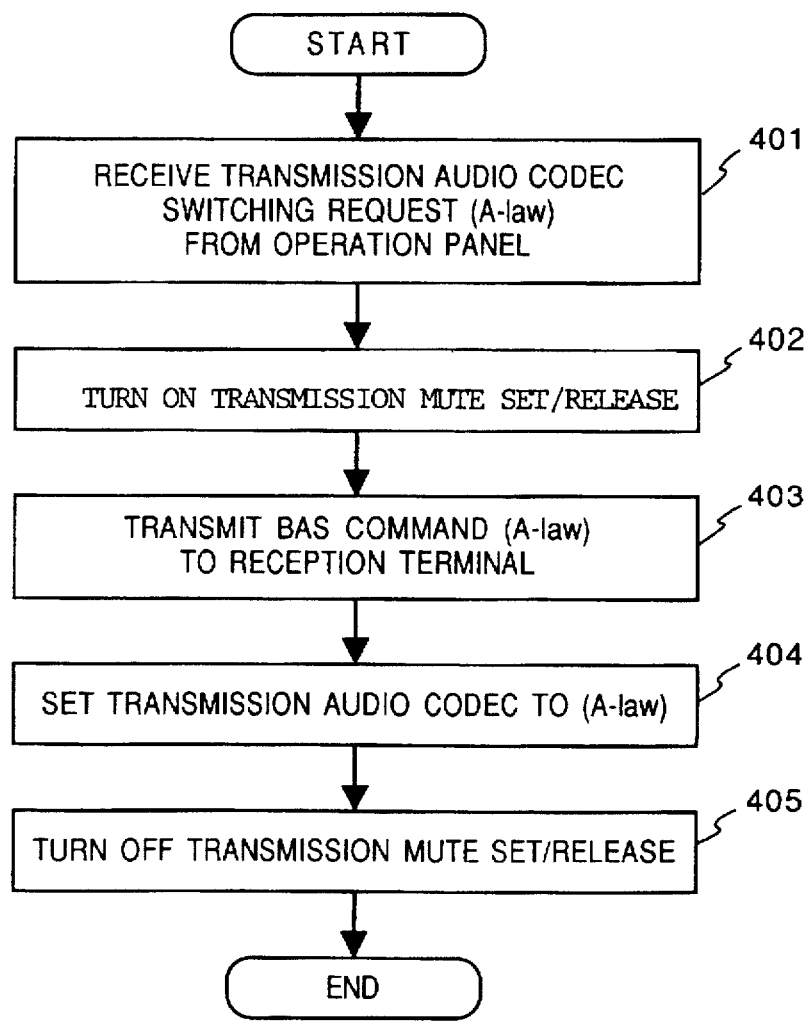
FIG. 4 is a flowchart to explain the operation of the communication apparatus which switches an audio transmission mode in the embodiment of FIG. 1.

First, referring to FIG. 4, an example of the operation of the transmission-side communication apparatus where the audio transmission mode switching of the first embodiment of FIG. 1 is described. The control program which executes this processing is included in the in-channel control unit 13c.

In FIG. 4, when the information to switch the audio transmission mode from (µ-law) to (µ-law) is received from the operation panel 12 at step S401, a control signal 21 is outputted to audio CODEC 5 and a transmission mute set/release 5a is turned on at step S402. The process proceeds to step S403 where (µ-law→A-law) BAS command to switch the audio transmission mode is transmitted to the terminal of the other party via the network interface 15. Then, at step S404, the control signal 21 is outputted and the transmission audio CODEC is switched from the µ-law CODEC 5e to the A-law CODEC 5d by the CODEC switcher 5c. The process proceeds to step S405 where the transmission mute set/release 5a of the audio CODEC 5 is turned off by the control signal 21 and the processing ends.

Figure 5:
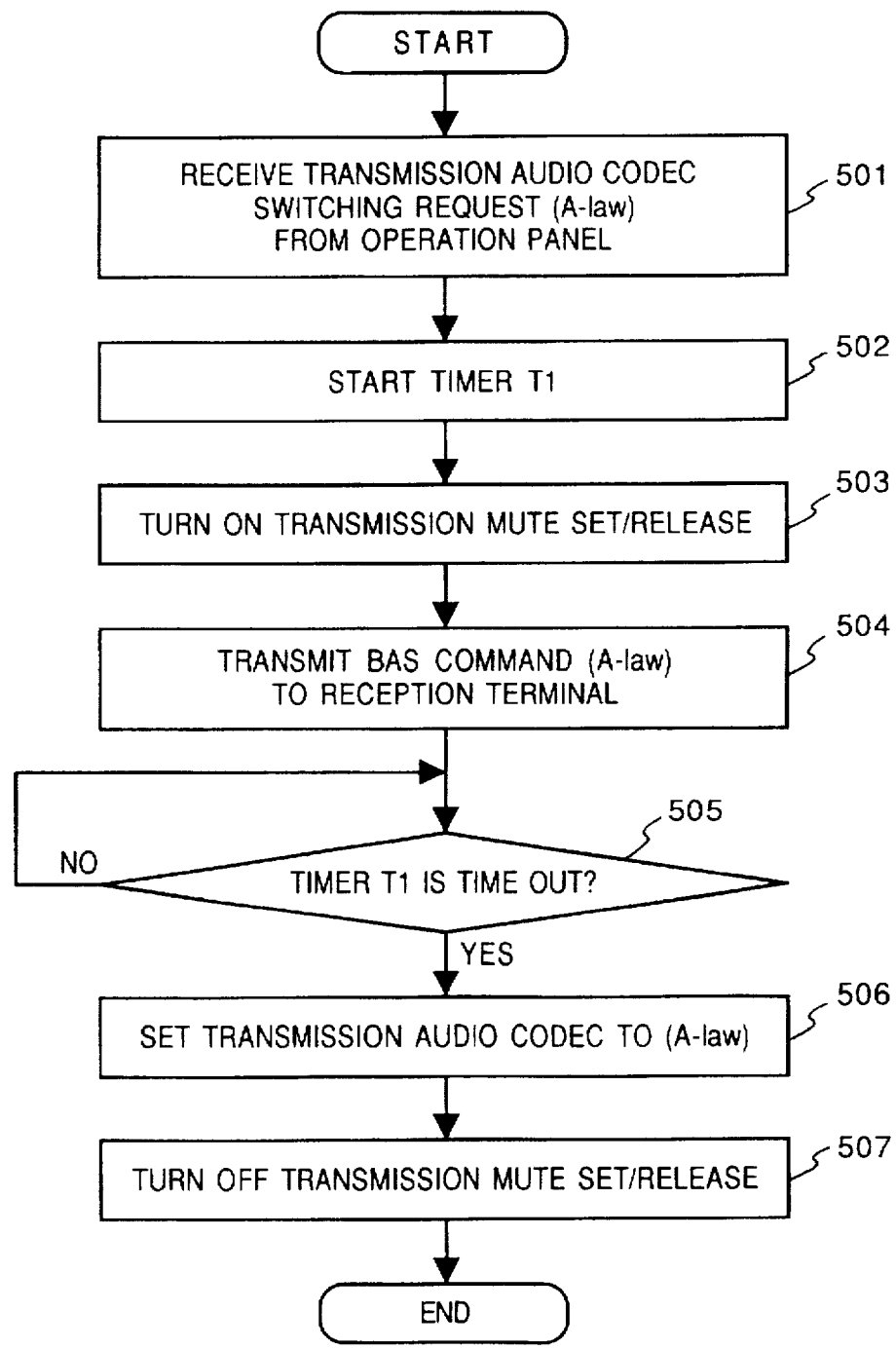
FIG. 5 is a flowchart to explain the operation of the communication apparatus which switches the audio transmission mode, and is a modification of the operation show in FIG. 4.

Next, referring to FIG. 5, another example of the operation of the transmission-side communication terminal where the audio transmission mode switching is described. This is a modification of the processing shown in FIG. 4.

At step S501, when the instruction to switch the audio transmission mode from (µ-law) to (A-law) is inputted from the operation panel 12, which is similar to step S401, the timer T1 is started at step 502. The process proceeds to step S503, similar to step S402 of FIG. 4, the transmission mute set/release 5a is turned on. At step S504, the (µ-law→A-law) BAS command to switch the audio transmission mode of the terminal of the other party is transmitted from the in-channel control unit 13c. Then, the process proceeds to step S505 where it is determined if the timer T1 which is started at step S502 has expired. When the timer T1 expires, similar to step S404 of FIG. 4, the process proceeds to step S506 where the transmission CODEC is switched from the (µ-law) to (A-law) by the CODEC switcher 5c. Then, the process proceeds to step S507, similar to step 405 of FIG. 4, where the transmission mute set/release 5a is turned off by the control signal 21, and the processing ends.

The transmission of audio information is inhibited after the BAS command is transmitted until the audio reception mode is switched in the reception terminal. Therefore, generation of noise is suppressed at the reception terminal.

Figure 6:
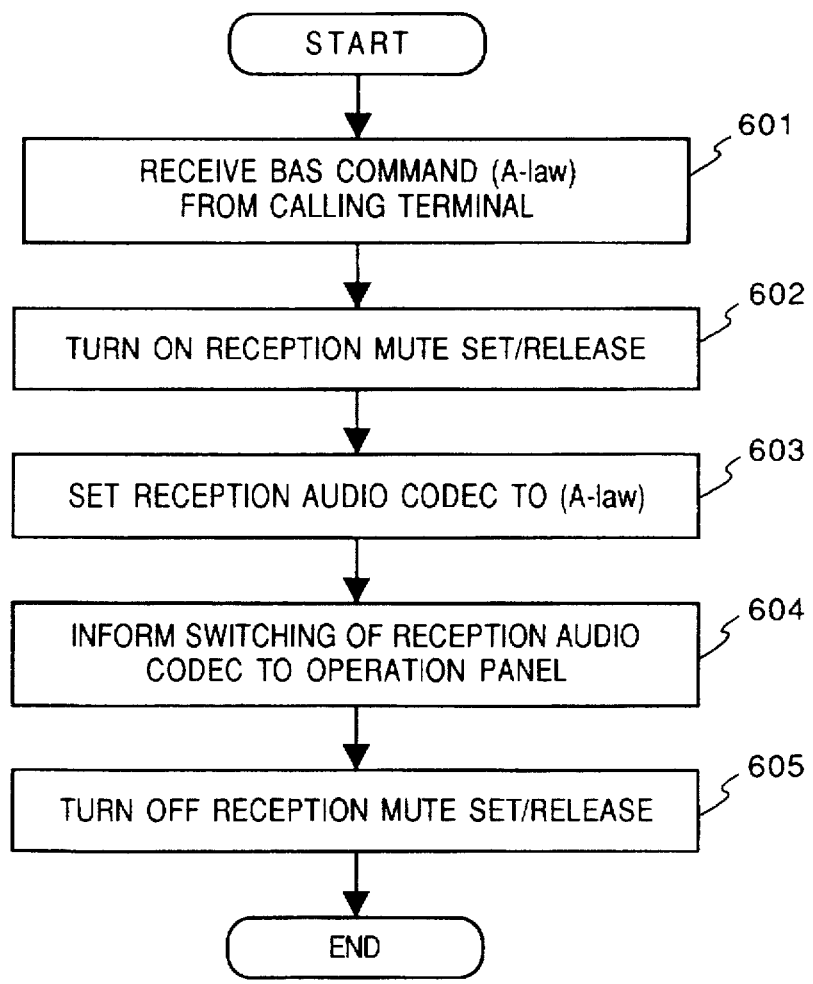
FIG. 6 is a flowchart to explain the operation of the communication apparatus which switches an audio reception mode in the embodiment of FIG. 1.

Referring to FIG. 6, another example of the operation of the communication apparatus where an audio reception mode switching in the embodiment of FIG. 1 is described. The program which executes this processing is included in the in-channel control unit 13c.

At step S601, the (µ-law→A-law) BAS command to switch the audio reception mode is received from the transmission terminal of the other party via the network interface 15. This BAS command is transmitted from the transmission-side terminal in accordance with the flowchart of FIG. 4 or FIG. 5. Then, the process proceeds to step S602 where the reception mute set/release 5b of the audio CODEC 5 is turned on by the control signal 21. The process proceeds to step S603 where the reception audio CODEC is switched from the µ-law CODEC 5e to the A-law CODEC 5d by the CODEC switcher 5c. The process then proceeds to step S604 where the fact that the audio reception mode is switched from (µ-law) to (A-law) is indicated to the operation panel 12. Accordingly, a lamp (not shown) indicating the reception mode is lit on the operation panel 12. Then, the process proceeds to step S605 where the reception mute set/release 5b is turned off by the control signal 21 and the processing ends.

Figure 7:
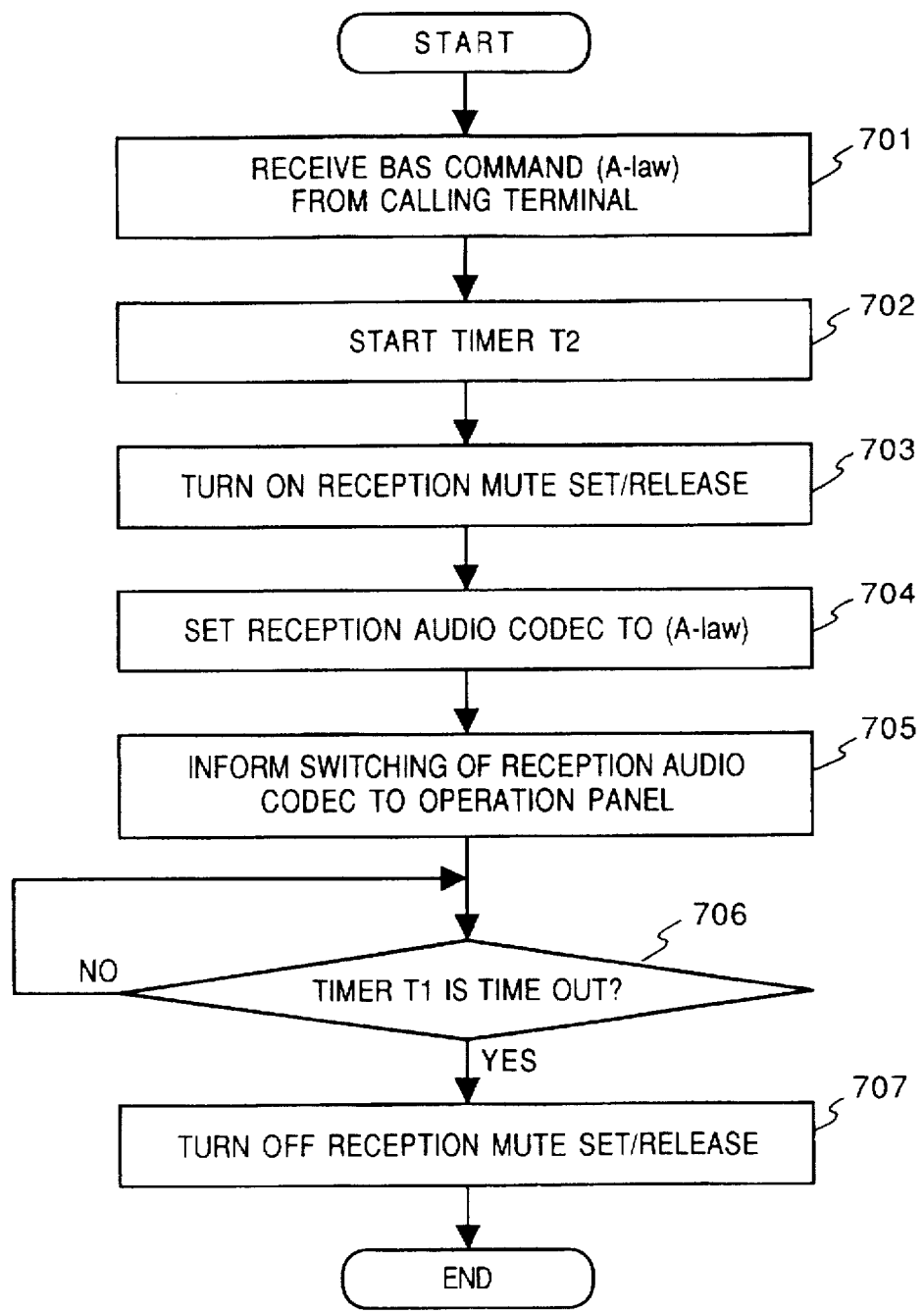
FIG. 7 is a flowchart to explain the operation of the communication apparatus which switches the audio reception mode, and is a modification of the operation show in FIG. 6.

Next, referring to FIG. 7, another example of the operation of the communication terminal where the audio reception mode switching is described. This is a modification of the processing shown in FIG. 6.

At step S701, similar to step S601 of FIG. 6, when the (µ-law→A-law) BAS command to switch the audio reception mode is received from the terminal of the other party, the process proceeds to step S702 where the timer Ti is started. Then, the process proceeds to step S703, similar to step S602 of FIG. 6, where the reception mute set/release 5b is turned on. The process then proceeds to step S704, similar to step S603, where the audio reception CODEC is switched from (µ-law) to (A-law) by the CODEC switcher 5c.

At step S705, similar to step S604, the fact that the audio reception mode is switched from (µ-law) to (A-law) is indicated to the operation panel 12. The process proceeds to step S706 where it is determined if the timer T1 which is started at step S702 has expired. When the time has expired, similar to step S605 of FIG. 6, the process proceeds to step S707 where the reception mute set/release 5b is turned off in the same way as that of step 605, and the processing ends.

The audio information which has been transmitted before the audio transmission mode is switched at the transmission terminal is not outputted from the reception terminal.

Figure 8:
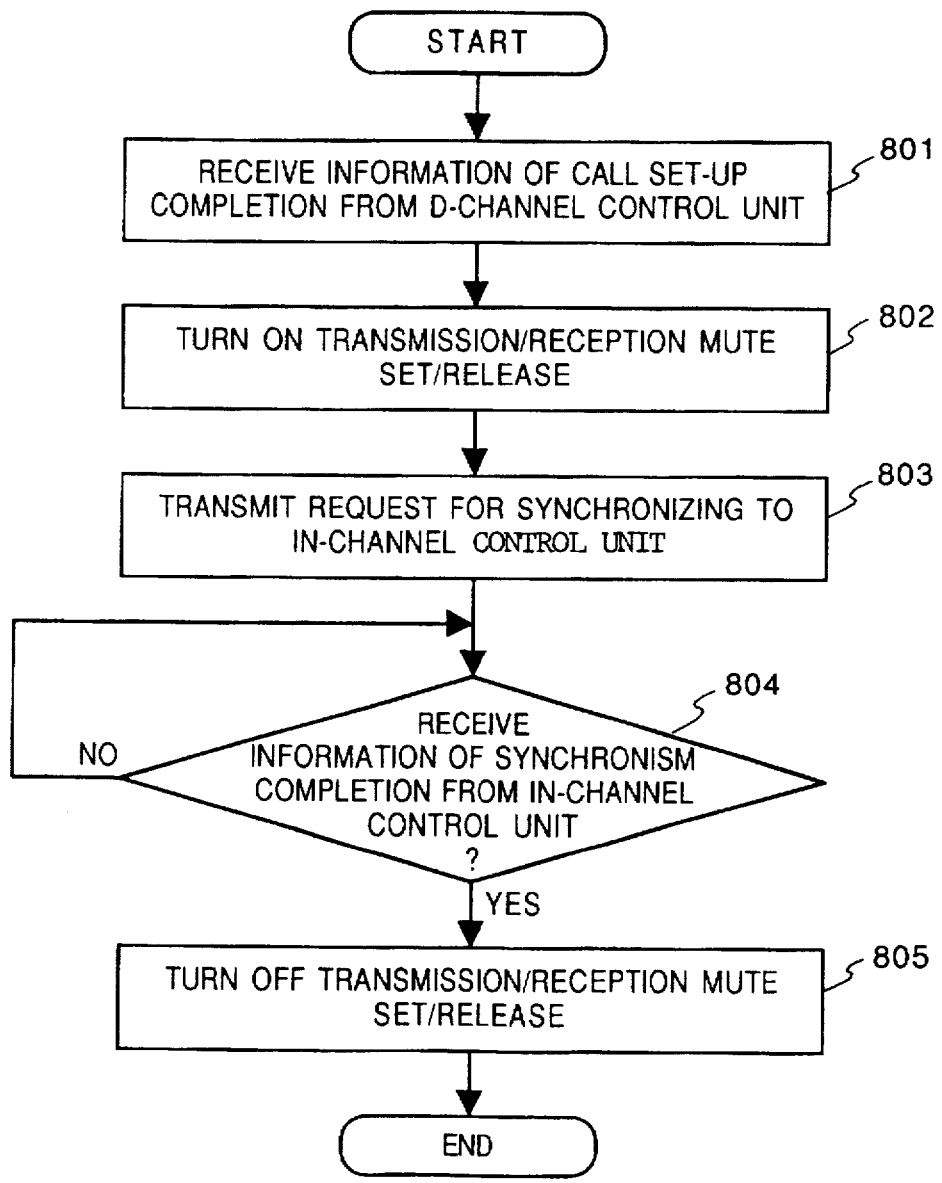
FIG. 8 is a flowchart to explain the operation of the communication apparatus at the start of communication in the embodiment of FIG. 1.

Referring to FIG. 8, the control operation of the audio CODEC according to the program in the main control unit 13a at the start of the communication in the embodiment of FIG. 1, is described below.

First, at step S801, the information such as a call set-up has been completed is received from the program of the D-channel control unit 13b. At step S802, the transmission mute set/release 5a and the reception mute set/release 5b are both turned on by outputting the control signal 21 to the audio CODEC 5, and the audio information to be transmitted or received is put in the state of mute. The process proceeds to step S803 where a request signal for synchronizing with the in-channel is transmitted to the program of the in-channel control unit 13c. The process proceeds to step S804 where it is determined if this information is received from the in-channel control unit 13c. If received, the process proceeds to step S805 where the transmission and reception mute set/release 5a, 5b are both turned off by he control signal 21. After the state of mute is released, the processing ends.

Figure 9:
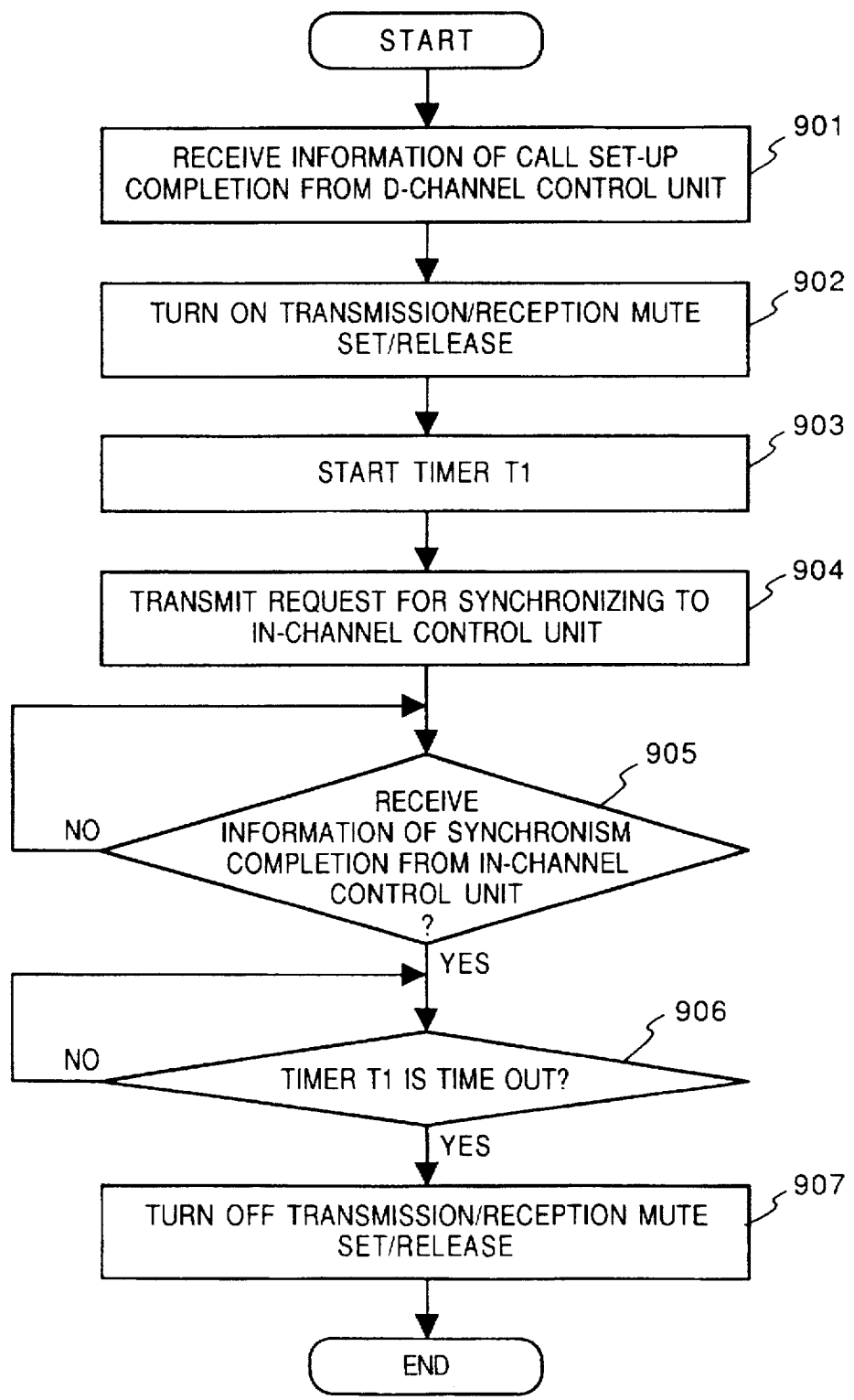
FIG. 9 is a flowchart to explain the operation of the communication apparatus at the start of communication, and is a modification of the operation show in FIG. 8.

Referring to FIG. 9, an example of the control operation of the audio CODEC according to the program of the main control unit 13a at the start of communication is described. This is a modification of FIG. 8.

At step S901, similar to step S801, when the information such as a call set-up has been completed is received from the D-channel control unit 13b, the process proceeds to step S902 where the control signal 21 is outputted to the audio CODEC 5 and the transmission and reception mute set/release 5a, 5b are both turned on. The process proceeds to step S903 where the timer T1 is started for timing out the predetermined time. At step S904, similar to step S803, a request signal for synchronizing with the in-channel is transmitted to the program of the in-channel control unit 13c.

The process proceeds to step S905, similar to step S804, where it is determined if the information is received from the in-channel control unit 13c. If received, the process proceeds to step S906 where it is determined if the timer T1 which is started at step S903 has expired. If the predetermined time has passed and the timer T1 has expired, the process proceeds to step S907 where the transmission and reception mute set/release 5a, 5b are both turned off. After the state of mute is released, the processing ends.

The audio noise can be suppressed when the transmission audio CODEC and the reception audio CODEC are switched in a case of initializing of the audio communication mode, even if the coding method is not corresponding to the decoding method, for the difference between the timing of switching of the transmission audio CODEC and the timing of switching of the reception audio CODEC.

The time set in the timer T1 in FIGS. 5, 7, and 9 can be arbitrary.

As described above, in connection with the operation of FIG. 4, the audio information when the transmission audio CODEC is switched can be prevented from being outputted to the network.

Furthermore, in accordance with the operation of FIG. 5, the audio information which has been received before switching can be prevented from being inputted to the reception audio CODEC after the switching, even if the timing for switching the reception audio CODEC is staggered in the reception-side terminal. Accordingly, generation of noise which is caused by the fact that coding mode differs from the decoding mode can be suppressed.

Furthermore, in connection with the operation of FIG. 6, the sound at switching of the reception audio CODEC can be prevented from being outputted.

Still further, in accordance with the operation of FIG. 7, the audio information between the time when the transmission audio CODEC is switched and when the reception audio CODEC is switched can be prevented from being outputted to the network.

Still further, in accordance with the operation FIG. 8, the audio information when the transmission audio CODEC and reception audio CODEC at setting the audio communication mode initialization can be prevented from being outputted.

Still further, in accordance with the operation of FIG. 9, the data when the transmission audio CODEC and reception audio CODEC are switching at setting the audio communication mode initialization and the audio information when the audio coding and decoding are performed by a different audio CODEC caused by a timing gap between the transmission and reception can be prevented from being outputted.

As many apparently widely different embodiments of the present invention can be made without departing from the spirit and scope thereof, it is to be understood that the invention is not limited to the specific embodiments thereof except as defined in the appended claims.

What is claimed is:

1. A communication apparatus which transmits audio information to a terminal of a reception side having decode means, comprising:

a plurality of coding means for coding transmitting audio information by a different coding mode in each of said plurality of coding means;

determining means for determining which one of the plurality of coding means to be used in order to code the transmitting audio information;

generating means for generating data representing a type of the coding means determined by said determining means;

sending means for sending the data representing the type of the coding means to the terminal of the reception side;

timer means for timing a predetermined time period for sending of the data representing the type of the coding means by said sending means;

setting means for setting the coding means determined by said determining means to code the transmitting audio information after a lapse of the predetermined time period; and muting means for muting outputs of the plurality of coding means at least while sending the data representing the type of the coding means by said sending means and while setting the coding means by said setting means.

2. The communication apparatus according to claim 1, wherein said muting means mutes the output of the plurality of coding means after call set-up completion but prior to synchronism with in-channel communications.

3. The communication apparatus according to claim 1, wherein said muting means mutes the output of the plurality of coding means during a capability exchange sequence for the terminal of the reception side.

4. A communication apparatus which receives audio information from a terminal of transmission side, comprising:

a plurality of decoding means for decoding received audio information by using a different decoding mode in each of said plurality of decoding means;

setting means for setting one decoding means so as to determine which one of the plurality of decoding means is to be used in accordance with an instruction received from the terminal of the transmission side;

timer means for timing a predetermined time period; and muting means for muting the received coded audio information during the predetermined time period after said setting means sets the decoding means.

5. The communication apparatus according to claim 4, wherein said muting means mutes said received coded audio information after call-set-up completion but prior to synchronism with in-channel communications.

6. The communication apparatus according to claim 4, wherein said muting means mutes said received coded audio information during a capability exchange sequence for the terminal of the reception side.

7. A communication apparatus which communicates audio information with an external device, comprising:
- a plurality of coding means for coding transmitting audio information by a different coding mode in each of said plurality of coding means;
- determining means for determining which one of the plurality of coding means to be used in order to code the transmitting audio information;
- generating means for generating data representing a type of the coding means determined by said determining means;
- sending means for sending the data representing the type of the coding means to the external device;
- timer means for timing a predetermined time period after sending the data representing the type of the coding means by said sending means;
- first setting means for setting the coding means determined by said determining means after a lapse of the predetermined time period, to code the transmitting audio information, in accordance with a determination by said determining means;
- first muting means for muting outputs of the plurality of coding means at least while sending the data representing the type of the coding means by said sending means and while setting the coding means by said setting means;
- a plurality of decoding means for decoding received audio information by using a different decoding mode in each of said plurality of decoding means;
- second setting means for setting the decoding means so as to determine which one of the plurality of decoding means to be used in accordance with the data representing the type of the coding means sent by said sending means; and
- second muting means for muting the received coded audio information while setting said decoding means by said second setting means.

8. The communication apparatus according to claim 7, wherein said first muting means mutes the outputs of the plurality of coding means after call set-up completion but prior to synchronism with in-channel communications.

9. The communication apparatus according to claim 7, wherein said second muting means mutes said received coded audio information after call set-up completion but prior to synchronism with in-channel communications.

10. The communication apparatus according to claim 7, wherein said first muting means mutes the outputs of the plurality of coding means during a capability exchange sequence for the external device.

11. The communication apparatus according to claim 7, wherein said second muting means mutes said received coded audio information during a capability exchange sequence for the external device.

12. A communication apparatus which communicates audio information with an external device, comprising:
- a plurality of coding means for coding transmitting audio information by a different coding mode in each of said plurality of coding means;
- determining means for determining which one of the plurality of coding means to be used in order to code the transmitting audio information;
- generating means for generating data representing a type of the coding means determined by said determining means;
- sending means for sending the data representing the type of the coding means to the external device;
- first setting means for setting the coding means determined by said determining means to code the transmitting audio information, in accordance with a determination by said determining means;
- first muting means for muting outputs of the plurality of coding means at least while sending the data representing the type of the coding means by said sending means and while setting the coding means by said setting means;
- a plurality of decoding means for decoding received audio information by using a different decoding mode in each of said plurality of decoding means;
- second setting means for setting the decoding means so as to determine which one of the plurality of decoding means to be used in accordance with the data representing the type of the coding means sent by said sending means;
- timer means for timing a predetermined time period after reception of the data representing the type of the coding means sent by said sending means; and
- second muting means for muting the received coded audio information during the predetermined time period.

13. A method for transmitting audio information to a terminal of a reception side having decode means, comprising the steps of:
- coding transmitting audio information by a different coding mode in each of a plurality of coding means;
- determining which one of the plurality of coding means to be used in order to code the transmitting audio information;
- generating data representing a type of the coding means determined in said step of determining;
- sending the data representing the type of the coding means to the terminal of the reception side;
- setting the coding means determined in said step of determining to code the transmitting audio information;
- timing a predetermined time period for sending of the data representing the type of the coding means; and
- muting outputs of the plurality of coding means at least while sending the data representing the type of the coding means and while setting the coding means.

14. A method for receiving audio information from a terminal of a transmission side, comprising the steps of:
- decoding received audio information by using a different decoding mode in each of a plurality of decoding means;
- setting one decoding means so as to determine which one of the plurality of decoding means to be used in accordance with an instruction received from the terminal of the transmission side;
- timing a predetermined time period after setting one decoding means in said setting step; and
- muting the received coded audio information during the predetermined time period.

15. A method for communicating audio information with an external device, comprising the steps of:

coding transmitting audio information by a different coding mode in each of a plurality of coding means;

determining which one of the plurality of coding means to be used in order to code the transmitting audio information;

generating data representing a type of the coding means determined in said step of determining;

sending the data representing the type of the coding means to the external device;

setting the coding means determined in said step of determining to code the transmitting audio information;

timing a first predetermined time period after sending the data representing the type of the coding means;

muting outputs of the plurality of coding means at least while sending the data representing the type of the coding means and during the first predetermined time period;

decoding received audio information by using a different decoding mode in each of a plurality of decoding means;

setting the decoding means so as to determine which one of the plurality of decoding means to be used in accordance with the data representing the type of the coding means sent in said sending step;

timing for a second predetermined time period after reception of the data representing the type of the coding means; and muting the received coded audio information during the second predetermined time period.

16. A communication apparatus which transmits audio information to a terminal of a reception side having decode means, comprising:

a plurality of coding means for coding transmitting audio information by a different coding mode in each of said plurality of coding means;

determining means for determining which one of the plurality of coding means to be used in order to code the transmitting audio information;

generating means for generating data representing a type of the coding means determined by said determining means;

sending means for sending the data representing a type of the coding means to the terminal of the reception side;

setting means for setting the coding means determined by said determining means to code the transmitting audio information; and muting means for muting outputs of the plurality of coding means at least while sending the data representing the type of the coding means by said sending means and while setting the coding means by said setting means, so as to prevent generating a decoding error in the decode means of the terminal of reception side.

17. A communication apparatus which receives audio information from a terminal of transmission side, comprising:

a plurality of decoding means for decoding received audio information by using a different decoding mode in each of said plurality of decoding means;

setting means for setting one decoding means so as to determine which one of the plurality of decoding means is to be used in accordance with an instruction received from the terminal of the transmission side; and muting means for muting the received audio information while said setting means sets said decoding means, so as to prevent from generating a decoding error in said decoding means set by said setting means.

18. A communication apparatus which communicates audio information with an external device, comprising:

a plurality of coding means for coding transmitting audio information by a different coding mode in each of said plurality of coding means;

determining means for determining which one of the plurality of coding means to be used in order to code the transmitting audio information;

generating means for generating data representing a type of the coding means determined by said determining means;

sending means for sending the data representing the type of the coding means to the external device;

first setting means for setting the coding means determined by said determining means to code the transmitting audio information, in accordance with a determination by said determining means;

first muting means for muting outputs of the plurality of coding means at least while sending the data representing the type of the coding means by said sending means and while setting the coding means by said setting means, so as to prevent from generating a decoding error in the external device;

a plurality of decoding means for decoding received audio information by using a different decoding mode in each of said plurality of decoding means;

second setting means for setting the decoding means so as to determine one of the plurality of decoding means to be used in accordance with the data representing the type of the coding means sent by said sending means; and second muting means for muting the received coded audio information while setting said decoding means by said second setting means, so as to prevent from generating a decoding error in said decoding means set by said second setting means.

* * * * *

UNITED STATES PATENT AND TRADEMARK OFFICE
CERTIFICATE OF CORRECTION

PATENT NO. : 5,784,457
DATED : July 21, 1998
INVENTOR(S) : Yoshito Haba

It is certified that error appears in the above-identified patent and that said Letters Patent is hereby corrected as shown below:

On the Cover Page, under Item [54], line 3, change "MATING" to --MUTING--.

Col. 1, line 3, change "MATING" to --MUTING--.

Col. 3, line 49, change "show" to --shown--.

Col. 3, line 56, change "show" to --shown--.

Col. 3, line 63, change "show" to --shown--.

Col. 5, line 38, delete "first".

Col. 7, line 12, change "he" to --the--.

Col. 10, line 59, change "after" to --before--.

Signed and Sealed this

Second Day of March, 1999

*Attest:*

Q. TODD DICKINSON

*Attesting Officer*      Acting Commissioner of Patents and Trademarks